(12) United States Patent
Butts et al.

(10) Patent No.: US 7,792,933 B2
(45) Date of Patent: Sep. 7, 2010

(54) SYSTEM AND METHOD FOR PERFORMING DESIGN VERIFICATION

(75) Inventors: Michael R. Butts, Portland, OR (US); Elliot H. Mednick, Salem, NH (US)

(73) Assignee: Cadence Design Systems, Inc., San Jose, CA (US)

( * ) Notice: Subject to any disclaimer, the term of this patent is extended or adjusted under 35 U.S.C. 154(b) by 1501 days.

(21) Appl. No.: 10/614,537

(22) Filed: Jul. 3, 2003

(65) Prior Publication Data

US 2005/0022143 A1     Jan. 27, 2005

(51) Int. Cl.
    *G06F 15/177*     (2006.01)
    *G06F 15/173*     (2006.01)
(52) U.S. Cl. ...................... 709/222; 709/224
(58) Field of Classification Search ................ 709/223, 709/224, 228, 230, 222
See application file for complete search history.

(56) References Cited

U.S. PATENT DOCUMENTS

| 6,061,349 | A | * | 5/2000 | Coile et al. | ................ | 370/389 |
| 6,574,239 | B1 | * | 6/2003 | Dowling et al. | ............. | 370/469 |
| 7,035,323 | B1 | * | 4/2006 | Arato et al. | ................. | 375/222 |

OTHER PUBLICATIONS

ProDesign GmbH, "CHIPit Gold Edition," Copyright 2003, 2 pages, available at http://www.chipit.de/ce/CHIPitGoldEdition_UMRbus.htm.

ProDesign GmbH, "Speeding Verification of Custom Designs," Embedded Systems Europe, Jun. 2003, 2 pages, available at http://www.chipit.de/ce/pdf/whitepaper/Embedded%20Europe.pdf.

ProDesign GmbH, "Crack the Bottleneck Problem," Mar. 2002, 4 pages, available at http://www.chipit.de/ce/pdf/whitepaper/crack.pdf.

Aptix Corporation, "Module Verification Platform," Product Brief, Fourth Quarter 2001, 2 pages.

SynaptiCAD, Inc., "PinPort links Hardware to HDL Simulations," Copyright 2001, 3 pages, available at http://www.syncad.com/pinport_main.htm?SynaptiCADSessionID=515fc200d23dcc19578a3f87f2fef366.

* cited by examiner

*Primary Examiner*—Hussein A El Chanti
(74) *Attorney, Agent, or Firm*—Orrick, Herrington & Sutcliffe LLP

(57) ABSTRACT

A design verification system for developing electronic systems and methods for manufacturing and using same. The design verification system comprises a plurality of system elements, including at least one physical (or hardware) element and/or at least one virtual (or software) element, which are coupled, and configured to communicate, via a general communication system. Since the system elements may be provided on dissimilar development platforms, each system element is coupled with the communication system via a co-verification interface, which is provided as a layered protocol stack to assure portability and flexibility. Through use of the co-verification interface, the design verification system can be configured to support a wide variety of mixed physical/virtual systems.

29 Claims, 4 Drawing Sheets

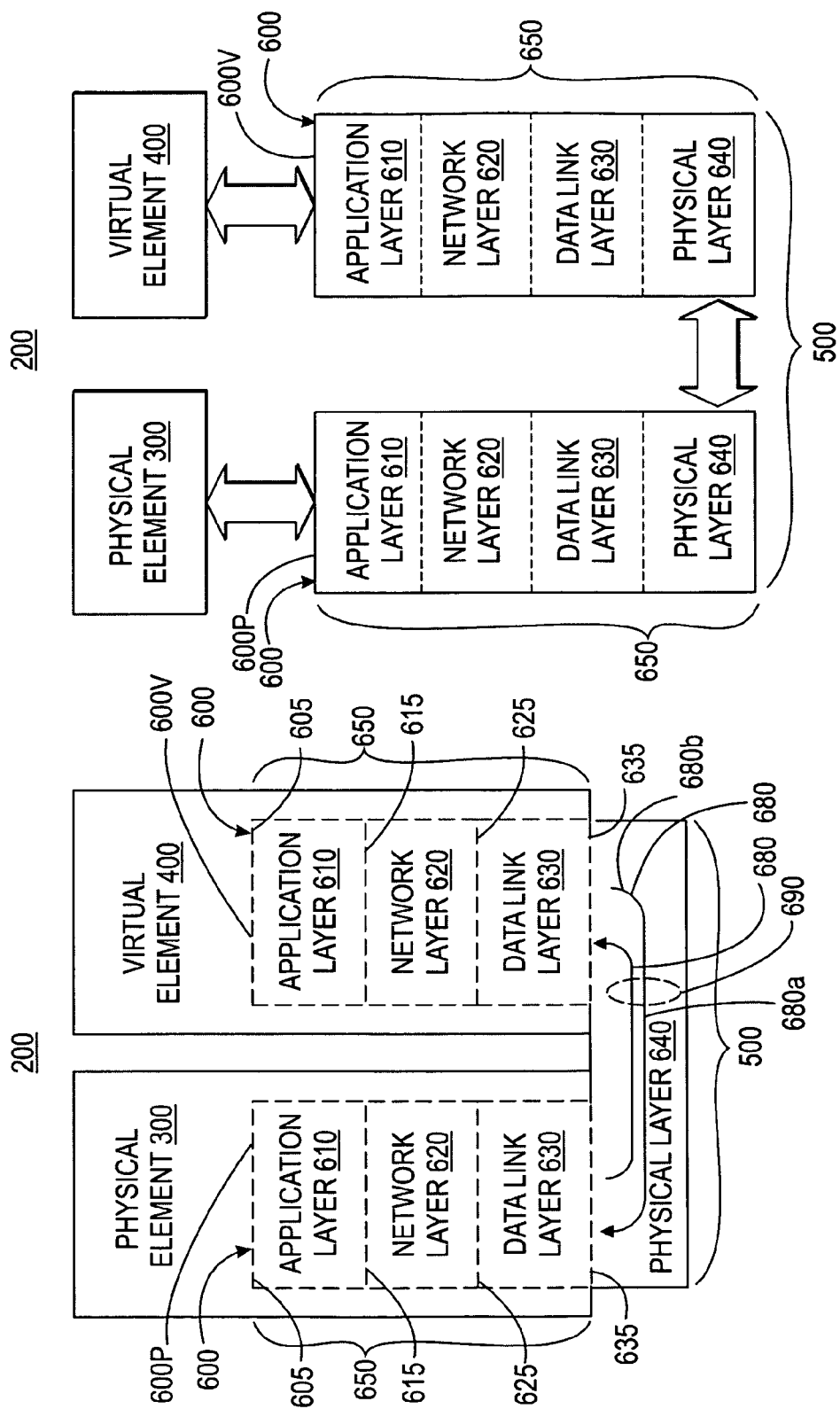

SYSTEM AND METHOD FOR PERFORMING DESIGN VERIFICATION

FIELD OF THE INVENTION

The present invention relates generally to design verification systems and more particularly, but not exclusively, to design verification systems for developing system-on-chip (SoC) modules.

BACKGROUND OF THE INVENTION

System-on-chip (SoC) technology presents a major revolution in the design of integrated circuits because of the unprecedented levels of integration possible. A system-on-chip has both hardware and software components. The hardware components can include one or more central processing units (CPUs), memory systems, special functions devices, buses, and interfaces; whereas, operating systems, applications, and drivers are exemplary software components.

Because the hardware components execute the software components, these hardware and software components are dependant on each other. Despite this, the hardware and software components typically are separately developed, often by different people. Since silicon turns (each "silicon turn" is a complete fabrication of chip) can account for a large portion of the total cost and time for developing a system-on-chip, considerable hardware verification is performed prior to fabrication. One important technique for performing functional verification of a system-on-chip involves executing the software components with real data to test a preselected percentage of the system-on-chip's total state space, a set of all reachable system states and transitions among these states.

Numerous methods have been used to perform co-verification of hardware and software components. For example, one technique involves modeling one or more hardware components in a Hardware Description Language (HDL) such as Verilog and simulating the modeled components by running the software components on an event-driven gate-level logic simulator. With current designs, presently available simulators and workstations have proven unsatisfactory because performance of such models ranges between approximately one and one thousand cycles per second, which is inadequate for operating the software components.

Similarly, one or more hardware components can be modeled at the instruction level in a high-level programming language, such as C or C++, by an instruction set simulator (ISS). The instruction set simulator can be readily developed and can operate the software components and modeled hardware components at a clock frequency of about ten thousand to one hundred thousand cycles per second. This is an improvement over the event driven simulators discussed above, but instruction-level instruction set simulators also have substantial limitations. Instruction set simulators, for instance, are not useful when cycle level accuracy is needed to model software execution speed, which often is necessary in media processing systems and other real-time embedded systems. A fully accurate cycle level instruction set simulator, which employs accurate models of internal pipelines, speculative execution, and cache and memory management unit (MMU) behavior, is very difficult to design. Further, since the central processing unit's cache and/or memory management unit typically are not modeled, instruction set simulators do not present the same sequence of transactions to both the modeled hardware components and physical hardware components.

Custom prototypes of new hardware components can be produced with one or more field programmable gate arrays (FPGAs) and/or with hardware assisted accelerators or emulators, such as the Palladium Accelerator/Emulator provided by Cadence Design Systems, Inc., of San Jose, Calif. The use of field programmable gate arrays however is limited to small, modular hardware components, while hardware assisted accelerators require custom processors, which can be expensive.

Physical platform development prototype boards, such as an ARM Integrator Development Board platform produced by ARM Limited in Cambridge, England, provide a platform with central processing units, memory systems, and other devices that are interconnected by buses and that are suitable for developing new hardware and software components for a system-on-chip designs. Each new component typically is independently debugged, generally requiring specially-developed testbench programs. Once produced in synthesizable register transfer level (RTL) form, the new components can be synthesized into a field programmable gate array in a field programmable gate array for verification at full speed. However, the new components, once in synthesizable register transfer level form, are difficult to debug and revise, resulting in increased cost and longer development times.

In view of the foregoing, a need exists for an improved design verification system that overcomes the aforementioned obstacles and deficiencies of currently-available design verification systems.

SUMMARY OF THE INVENTION

The present invention is directed toward a design verification system that is configured to couple, and transmit communication signals among, system elements of an electronic system under development.

The design verification system comprises a plurality of system elements, including at least one physical (or hardware) element and/or at least one virtual (or software) element, which are coupled, and configured to communicate, via a flexible communication system. The physical elements can comprise one or more electronic components, such as central processing units (CPUs), memory systems, and field programmable gate arrays (FPGAs), and typically are assembled on one or more hardware development platforms. Comprising software models of physical elements, each of the virtual elements can be modeled in a programming language or a Hardware Description Language (HDL) and are simulated via a software development platform, such as an accelerator, simulator, and/or emulator. The physical elements and the virtual elements each provide at least one hardware function, which contributes to the overall system function of the electronic system.

Since one or more of the system elements may be provided on an incompatible development platform, each system element is provided with a co-verification interface to facilitate communications among the system elements. The co-verification interfaces couple the system elements with the communication system and preferably is provided as a layered protocol stack to assure portability and flexibility. The system elements exchange communication signals via the communication system to execute the overall design verification system and to provide debugging services. Since the hardware development platforms can be configured to provide an operating system for the virtual elements, a number of clock cycles expended during interactions among the physical elements and the virtual elements can be reduced such that verification of the electronic system can be performed more quickly.

Considerable debugging of the electronic system can be achieved while the virtual elements remain in their virtual form. Once the electronic system is stable, one or more of the virtual elements can be refined to a register transfer level (RTL) form for further testing. The virtual elements subsequently can be compiled into a field programmable gate array (FPGA) for more extensive verification at full speed. As each virtual element is converted to a physical form, system performance and verification coverage increase.

Other aspects and features of the present invention will become apparent from consideration of the following description taken in conjunction with the accompanying drawings.

BRIEF DESCRIPTION OF THE DRAWINGS

FIG. 3A illustrates an embodiment of a layered co-verification interface for the design verification system of FIG. 2 in which the co-verification interfaces are disposed substantially within system elements and share a common physical layer.

FIG. 3B illustrates an alternative embodiment of the layered co-verification interface of FIG. 3A in which the co-verification interfaces are separate from the system elements and have separate physical layers.

Figure 2:
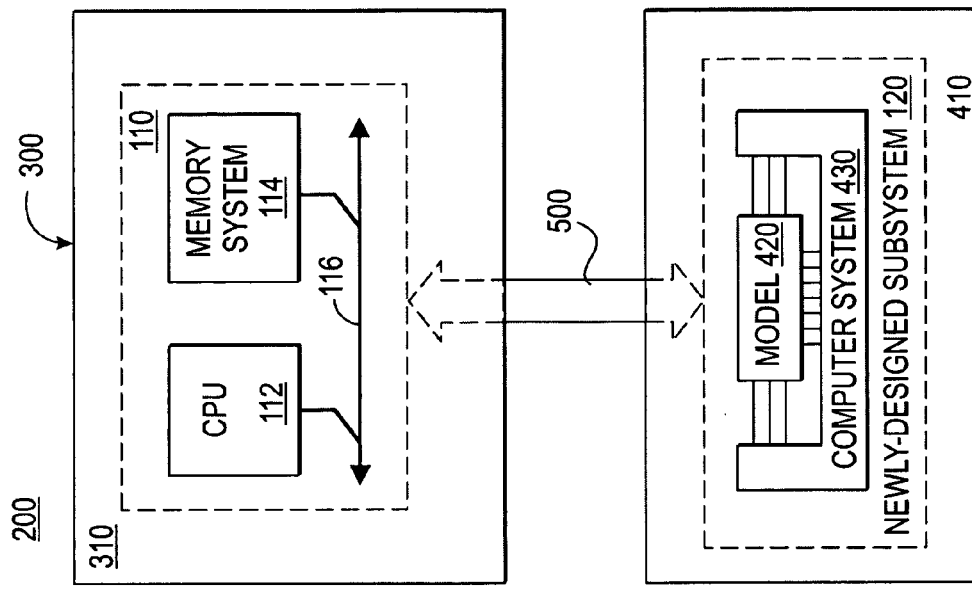
FIG. 2 is an exemplary block diagram of an embodiment of a design verification system.

It should be noted that the figures are not drawn to scale and that elements of similar structures or functions are generally represented by like reference numerals for illustrative purposes throughout the figures. It also should be noted that the figures are only intended to facilitate the description of the preferred embodiments of the present invention. The figures do not describe every aspect of the present invention and do not limit the scope of the invention.

DETAILED DESCRIPTION OF THE PREFERRED EMBODIMENTS

Since current design verification systems require highly accurate component modeling and can prove difficult and costly to implement, a design verification system that provides a flexible interface and protocol for interconnecting and co-verifying physical and virtual elements of an electronic system under development can prove much more desirable and provide a basis for a wide range of electronic applications, such as the development of system-on-chip (SoC) modules. This result can be achieved, according to one embodiment disclosed herein, by employing a design verification system 200 (shown in FIG. 2).

Figure 1:
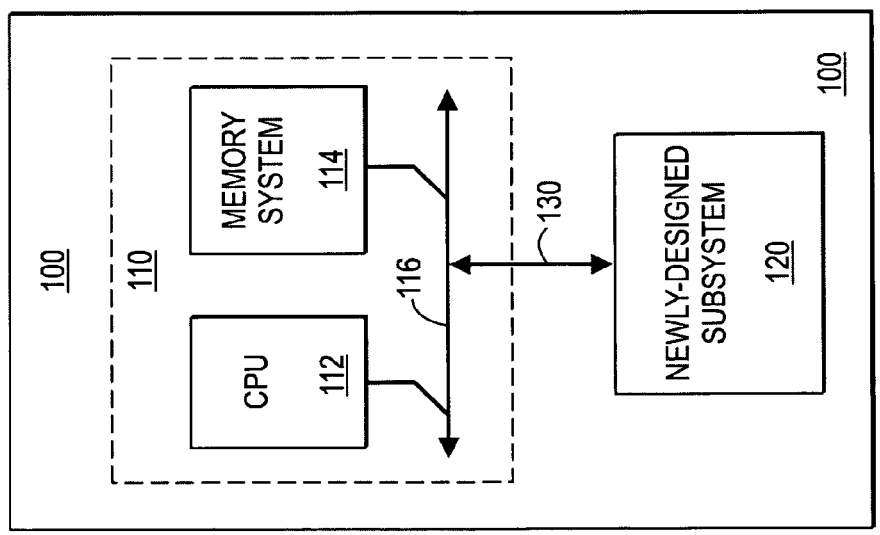
FIG. 1 is an exemplary block diagram of a typical electronic system under development.

Turning to FIG. 1, the development of an electronic system 100 normally involves an integration of one or more subsystems, including existing subsystems 110, newly-designed subsystems 120, or both. Although the electronic system 100 can comprise a new, but untested, combination of existing subsystems 110, a more typical electronic system 100 includes at least one newly-designed subsystem 120. For purposes of illustration, the electronic system 100 of FIG. 1 is shown and described as having one existing subsystem 110 and one newly-designed subsystem 120. However, it will be appreciated that the electronic system 100 can include any number and/or configuration of existing subsystems 110 and/or newly-designed subsystems 120. The existing subsystem 110 and the newly-designed subsystem 120 are configured to provide at least one hardware function, which contributes to the overall system function of the electronic system 100. Each of the hardware functions can be provided by one or both of the existing subsystem 110 and the newly-designed subsystem 120. When development is complete, the electronic system 100 can be integrated into an electronic package, such as a system-on-chip (SoC) module, and the existing subsystem 110 and the newly-designed subsystem 120 can be coupled, and configured to communicate, via one or more communication channels, such as a communication bus 130, as shown in FIG. 1.

During development, the existing subsystem 110 and the newly-designed subsystem 120 of the electronic system 100 can be provided on the design verification system 200 as illustrated in FIG. 2. The design verification system 200 comprises a plurality of system verification elements, such as one or more physical (e.g., hardware) verification elements 300 and/or virtual (e.g., software) verification elements 400, which are coupled, and configured to communicate, via a flexible communication system 500. The system elements 300, 400 are configured to execute a portion of the overall system function of the electronic system 100 and/or to provide debugging services for evaluating the electronic system 100. Although the design verification system 200 shown and described below as comprising one physical element 300 and one virtual element 400, it is understood that the design verification system 200 can be extended to any number and/or configuration of physical elements 300 and/or virtual elements 400.

The physical element 300 are provided as an arrangement of one or more physical electronic components, such as integrated components and/or discrete components, which typically are assembled on one or more hardware development platforms 310 in the manner known in the art. Each hardware development platform 310 can comprise a physical platform development prototype board like an ARM Integrator Development Board platform. As shown in FIG. 2, the physical element 300 can include any type of central processing units (CPUs) 112, memory systems 114, field programmable gate arrays (FPGAs), or a combination thereof, and are configured to communicate with each other via one or more internal communication channels, such as an internal communication bus 116. If desired, the physical element 300 can share at least one electronic component, such as the memory system 114 and/or the hardware development platform 310, with one or more other physical elements 300.

Similarly, the virtual element 400 includes one or more software models 420, which can be compiled and simulated via one or more software development platforms 410 in the manner known in the art. Comprising models 420 of at least one component, in whole or in part, of the electronic system 100, the virtual element 400 can be provided in any programming language, such as C, C++, SystemC, Perl, or Java, or in any Hardware Description Language (HDL), such as Verilog or Very High Speed Integrated Circuits Hardware Description Language (VHDL) and can be developed and/or stored on any type of computer system 430 that can process software. For example, the virtual element 400 can be provided on any type of processing system, including a personal computer, workstation, server, embedded processor, and/or digital signal processor (DSP), which is operating an operating system, such as Windows or UNIX. Exemplary software development platforms 410 include accelerators, simulators, and/or emulators of any kind, examples of which are an HDL simulator, an instruction set simulator (ISS), a SystemC simulator, or Cadence's Palladium Accelerator/Emulator. It will be appreciated that each virtual element 400 can be provided on substantially separate software development platforms 410 and/or that the software development platform 410 can be shared by two or more virtual elements 400.

The software models 420 can be provided in any level of abstraction. Abstraction is a modeling technique that eliminates details that make little or no contribution to the accuracy required by the intended use of the model 420. Contributing to the design and verification process by providing structure, the software models 420 can be quickly simulated and preferably are reusable, measurable for accuracy, and support the refinement of the software models 420 toward, for example, a Hardware Description Language (HDL) implementation level. Each software model 420 preferably includes a functional model and an interface model. The functional model can embody a substantially complete set of the hardware functions supported by the emulated component; whereas, the interface model includes a set of functions declared in terms of operations on transactions that facilitate communication with the model 420.

When the electronic system 100 is disposed on the design verification system 200, the existing subsystem 110 and the newly-designed subsystem 120 can be provided as one or more physical elements 300, one or more virtual elements 400, or a combination of both physical elements 300 and virtual elements 400. FIG. 2 illustrates a typical configuration of the design verification system 200 in which the existing subsystem 110 is provided as the physical element 300 and is assembled the hardware development platform 310; whereas, the newly-designed subsystem 120 comprises the virtual element 400, which is compiled and simulated on the software development platform 410. It will be appreciated, however, that the newly-designed subsystem 120 can be provided as a physical element 300 and/or that the existing subsystem 110 can be provided as a virtual element 400 when, for example, one or more components of the existing subsystem 110 are being revised or are otherwise unavailable. Thereby, the existing subsystem 110 and the newly-designed subsystem 120 both can comprise physical elements 300 or virtual elements 400, as desired.

In the manner discussed above, the physical element 300 and the virtual element 400 are coupled, and configured to communicate, via the communication system 500. The communication system 500 is configured to transmit communication signals (not shown) between the physical element 300 and the virtual element 400. Typically comprising data, address, and control signals, the communication signals can comprise messages for executing the design verification system 200 and/or for providing debugging services. Through use of the communication system 500, the design verification system 200 can employ the communication signals to communicate events, messages, transactions, debugging commands, data, and user-defined messages of any kind to and from the physical element 300 and the virtual element 400.

A message is the fundamental unit of transfer between system elements 300, 400 and can be provided with any suitable level of abstraction. Illustrative messages include commands, requests, or responses that are communicated between system elements 300, 400. In a signal-level interface, for example, a message can include information regarding one or more events and can be provided via one or more signals. An event is a change of state of a signal at a specific time or cycle and can include, for instance, a bus read or an interrupt going active; whereas, each signal comprises a net signal or a bus signal that is provided by the electronic system 100 and that corresponds with a hardware communication path, such as a wire or a bus. In contrast, a transaction-level interface is more abstract. Comprising a request and/or a response, a transaction can take place over a plurality of timesteps or cycles and can include information regarding one or more commands, addresses, and/or data words.

Transactions also can have one or more attributes, including user-defined attributes and/or meta attributes. User-defined attributes are typically chosen according to the minimal information required to communicate between blocks and include attributes such as address information, data information, and data size. Supporting analysis of the simulation results for design space exploration and/or functional verification, meta attributes can include a begin time for a transaction, an end time for a transaction, and fields to specific relationships between transactions to show, for example, cause and effect relationships. The manner in which transactions are realized can depend upon the programming language used. For example, SystemC realizes transactions as C++ classes.

Since the physical element 300 and the virtual element 400 may be provided on dissimilar, and potentially incompatible, development platforms 310, 410, at least one of the system elements 300, 400 can be provided with a co-verification interface 600 to facilitate communications between the physical element 300 and the virtual element 400, as shown in FIGS. 3A-B. Preferably, the physical element 300 and the virtual element 400 are both provided with the co-verification interface 600. As illustrated in FIG. 3A, the physical element 300 is coupled with the communication system 500 via a physical co-verification interface 600P; while, the virtual element 400 is coupled with the communication system 500 via a virtual co-verification interface 600V. As desired, the co-verification interface 600P can be disposed substantially within the physical element 300, as shown in FIG. 3A, and/or can be separate from the physical element 300, as illustrated in FIG. 3B. The co-verification interface 600V likewise can be disposed substantially within the virtual element 400, as shown in FIG. 3A, and/or can be separate from the virtual element 400, as illustrated in FIG. 3B. It also will be appreciated that the communication system 500 and the co-verification interfaces 600 can be combined such that the physical element 300 and the virtual element 400 can be coupled substantially via the co-verification interfaces 600 as shown in FIG. 3A.

To assure portability and flexibility, the co-verification interfaces 600 are provided as a layered protocol stack 650 as shown in FIG. 3A. The layering of the protocol stack 650 permits flexibility in the type of physical medium comprising the communication system 500 and in the type of the communication signals exchanged between the physical element 300 and the virtual element 400. Thereby, the physical medium comprising the communication system 500 is decoupled from the development platforms 310, 410. Being similar to standard network layering protocols, such as Transmission Control Protocol/Internet Protocol (TCP/IP) and Open Systems Interconnect Model (OSI), the co-verification interface 600 can support communication systems 700 with a wide variety of physical media, including IEEE-1394 FireWire, Interprocess Communication (IPC) pipes, Peripheral Component Interconnection (PCI), Ethernet, and custom cables and/or software forms, such as shared messaging or inter-process communications.

The communication system 500 can be provided with any appropriate configuration. For example, the communication system 500 can include one or more serial and/or parallel communication paths. The configuration of the communication system 500 preferably depends at least partially upon the characteristics of the communication signals exchanged between the physical element 300 and the virtual element 400 as well as the characteristics of the physical element 300 and/or the virtual element 400 themselves. The protocol stack 650 also can be configured to manage flow control between the physical element 300 and the virtual element 400 and server timeouts.

The protocol stack 650 of each co-verification interface 600 can include any suitable number of layers to facilitate communications between the physical element 300 and the virtual element 400. As illustrated in FIG. 3A, for example, the protocol stacks 650 of the co-verification interfaces 600P, 600V each preferably comprise at least three layers: an application layer 610, a network layer 620, and a data link layer 630. As desired, the communication system 500 can comprise a fourth layer, a physical layer 640, of the protocol stacks 650 as shown in FIG. 3B. Although shown and described below as forming the physical layer 640 of the protocol stacks 650, it is understood that the communication system 500 can be provided as a separate system from the protocol stacks 650 and can be coupled with the protocol stacks 650 in a manner similar to the manner described below with reference to the system elements 300, 400.

Each layer 610, 620, 630, 640 in the protocol stack 650 can be implemented in hardware, software, or a combination of hardware and software components. Preferably, each layer 610, 620, 630, 640 of the virtual co-verification interface 600V is implemented in software. In contrast, the physical co-verification interface 600P comprises layers 610, 620, 630, 640, which preferably are implemented in hardware. It will be appreciated that, when the design verification system 200 includes physical elements 300 and virtual elements 400 as shown in FIG. 3A, at least one layer 610, 620, 630, 640, such as the physical layer 640, of the co-verification interfaces 600P, 600V comprises both hardware and software components. Although the layers 610, 620, 630, 640 are shown and described as being separate for purposes of illustration, it is understood that the hardware and/or software components of two or more of the layers 610, 620, 630, 640 can be combined, for example, into a common field programmable gate array.

The protocol stacks 650 also include one or more coupling interfaces 605, 615, 625, 635, which preferably comprise standard interfaces for coupling the co-verification interfaces 600P, 600V with the system elements 300, 400, the physical layer 640 (e.g., the communication system 500). As shown in FIG. 3A, the coupling interfaces 605 can be disposed substantially between and coupled with the system elements 300, 400 and the application layers 610 of the respective co-verification interfaces 600P, 600V and provide a universal interface for coupling the application layers 610 with the system elements 300, 400. Each of the coupling interfaces 605, for example, can comprise a plurality of hardware and/or software Application Programming Interfaces (APIs) that are functionally equivalent and interchangeable and that are configured to couple the relevant protocol stack 650 and system element 300, 400. The coupling interfaces 615, 625 are respectively disposed substantially between the application layers 610 and the network layers 620 and between the network layers 620 and the data link layers 630

Each coupling interface 635 is disposed substantially between the respective data link layers 630 and physical layers 640. Although configurable to provide a universal interface for coupling the data link layers 630 of the co-verification interfaces 600P, 600V with the physical layers 640, the coupling interfaces 635 typically are defined by an industry standard, such as the IEEE-1394 FireWire standard, that is associated with the physical media of the physical layers 640. Therefore, the coupling interfaces 625, being disposed substantially between the network layers 620 and the data link layers 630, preferably are configured to provide the universal interface for coupling the co-verification interfaces 600P, 600V with the physical layers 640. By including the coupling interfaces 605, 615, 625, 635, the co-verification interfaces 600P, 600V become more universal and are configured to flexibly couple with a wide variety of system elements 300, 400 and/or physical layers 640.

The co-verification interfaces 600P, 600V are configured to handle a suitable number of communication channels between the system elements 300, 400. Each communication channel preferably provides a unidirectional communication path for transmitting the communication signals from one system element 300, 400 to another system element 300, 400. One communication channel, for example, can transmit peripheral data from the virtual element 400 to a hardware peripheral device (not shown), such as a printer system or display system, which is coupled with the physical element 300. A channel pair, comprising two communication channels that are configured to transmit the communication signals in opposite directions, can provide a bi-directional communication path between the system elements 300, 400. Likewise, a plurality of channel pairs can be advantageously disposed between the system elements 300, 400 to provide a plurality of communication connections, which may support the same and/or different types of communication signals. For example, one of the plurality of channel pairs can be configured to extend an Advanced Peripherals Bus (APB) provided by the physical element 300 to the virtual element 400; whereas, another of the channel pairs can transmit interrupt signals provided by the virtual element 400 to the physical element 300.

Figure 4:
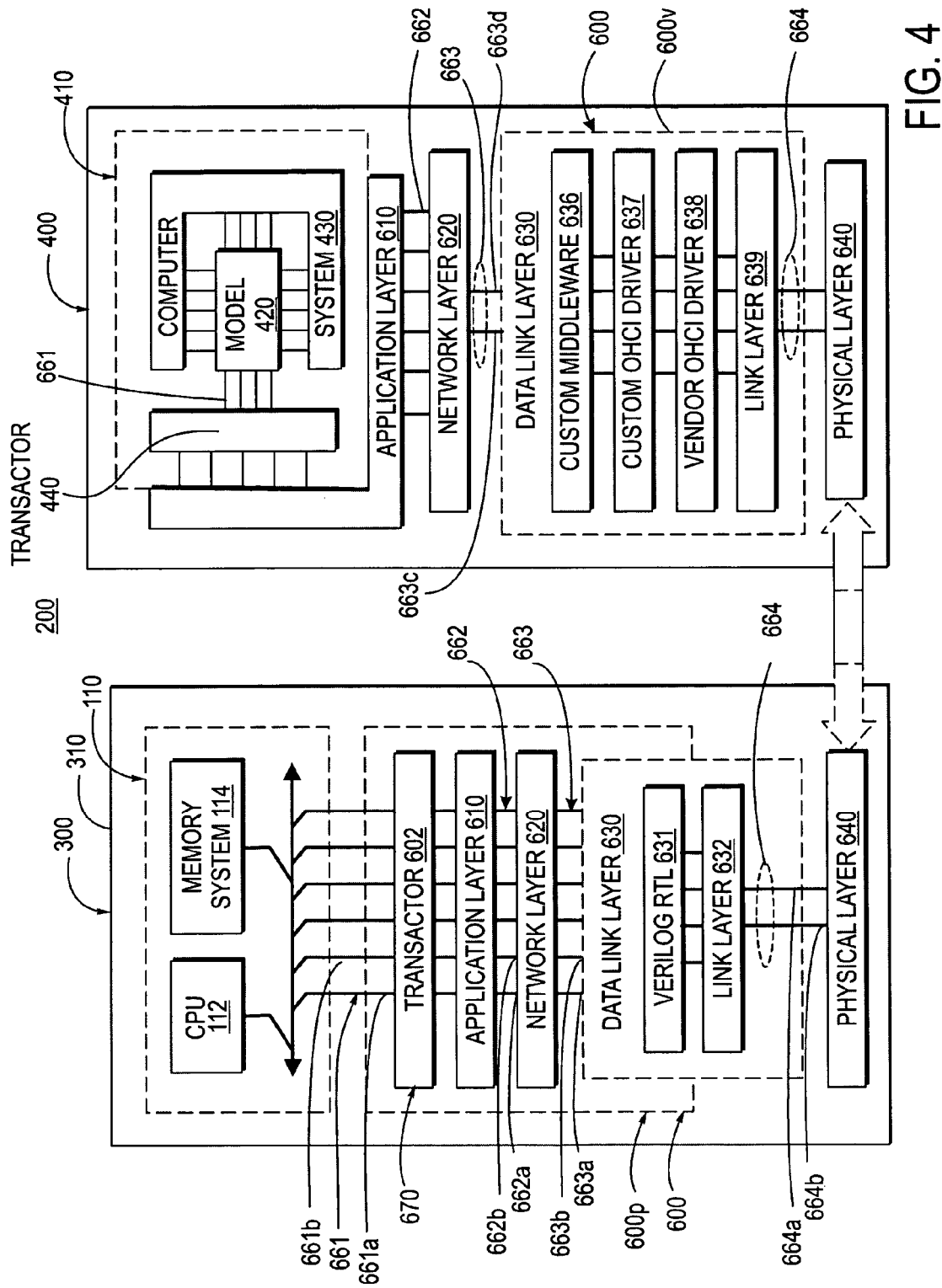
FIG. 4 is an illustrative schematic diagram of one implementation of the co-verification interface of FIGS. 3A-B.

The application layers 610 are configured to control the flow of the communication signals between the system elements 300, 400 and the network layers 620. The communication signals preferably are communicated between the system elements 300, 400 and the respective application layers 610 via any suitable number of electrical connections 661 as shown in FIG. 4. The configuration of the electrical connections 661 is application-dependent and can comprise a single electrical link for, for example, serial communication signals, and/or a plurality of electrical links, such as a communication bus. Being configured to form a portion of a communication channel between the system elements 300, 400, the electrical connections 661 can directly couple the system elements 300, 400 and the application layers 610, and/or, as illustrated in FIG. 4, the electrical connections 661 can couple the system elements 300, 400 and the application layers 610 indirectly, such as, via transactors 440, 602.

The transactors 440, 602 provide interfaces between the system elements 300, 400 and the network layers 620 and are configured to convert the communication signals exchanged between the system elements 300, 400 and the network layers 620. For example, the transactors 440, 602 can convert between signal-level communication signals and transaction-level communication signals in accordance with the Cadence Design Systems' publication, Transaction-Based Verification: TestBuilder User Guide" (July 2002), the disclosure of which is hereby incorporated herein by reference. The transactors 440, 602 can be disposed between the system elements

300, 400 in any manner. As shown in FIG. 4, for example, the transactor 440 can be provided adjacent to the software model 420 on the development platforms 410; whereas, the transactor 602 can be included in a field programmable gate array (FPGA) 670 that provides one or more of the layers 610, 620, 630, 640 of the physical co-verification interface 600P.

Likewise, one or more electrical connections 662 can be disposed substantially between the application layers 610 and the respective network layers 620. A number of the electrical connections 662 coupling the application layers 610 and the network layers 620 can be greater than, less than, or substantially equal to the number of electrical connections 661 coupling the application layers 610 and the system elements 300, 400. The electrical connections 662 can communicate the communication signals between the application layers 610 and the respective network layers 620, and, in the manner discussed above with reference to the electrical connections 661, the configuration of the electrical connections 662 is application-dependent and can comprise one or more electrical links. The application layer 610 includes a plurality of communication connections (not shown). The communication connections of the application layer 610 couple the electrical connections 661 and the electrical connections 662 such that two-way communication of the communication signals is permitted between the system elements 300, 400 and the network layers 620. The system elements 300, 400 thereby are configured to communicate outgoing communication signals to the network layers 620 and to receive incoming communication signals from the network layers 620 each via the communication connections of the application layers 610, forming a portion of a communication channel between the system elements 300, 400.

Each of the electrical connections 661, 662 preferably includes unidirectional electrical connection for transmitting or receiving the communication signals. For example, an electrical connection 661a can comprise a unidirectional electrical connection that is configured to transmit outgoing communication signals from the physical element 300 to the application layer 610; whereas, the physical element 300 can receive incoming communication signals from the application layer 610 via a unidirectional electrical connection 661b. The electrical connections 661a, 661b can be paired to form a bi-directional electrical connection between the physical element 300 and the application layer 610. Likewise, electrical connections 662a, 662b can be unidirectional electrical connections and be configured to exchange incoming and outgoing communication signals between the application layer 610 and the network layer 620. Also being paired to provide a bi-directional electrical connection between the application layer 610 and the network layer 620, the electrical connections 662a, 662b can be coupled, and configured to communicate, via the communication connections of the application layer 610 in the manner described above to form a portion of a bi-directional channel pair.

It will be appreciated that the application layer 610 can independently control the communication connections coupling the electrical connections 661 and the electrical connections 662. The communication connections thereby can be closed to inhibit an exchange of the communication signals between the physical element 300 and the network layer 620 and/or opened to allow the communication signals to be exchanged between the physical element 300 and the network layer 620, as desired.

The structure of the application layers 610 is application-dependent. For example, the application layer 610 of the virtual co-verification interface 600V can define signal-level event messages. The event messages include a control command and at least one data field. The control command is configured to control evaluation and clocking of the virtual element 400; whereas, the data fields utilize two-state or four-state logic systems that can be used singly and/or packed into multi-bit vectors. Preferably, the communication signals associated with the virtual element 400 substantially correspond to Open Model Interface (OMI)-specified values in accordance with the IEEE Standard Interface for Hardware Description Models of Electronic Components, Std. 1499-1998 (November 1999), the disclosure of which is hereby incorporated herein by reference, to minimize conversion. The application layer 610 of the virtual co-verification interface 600V thereby is sufficiently general and flexible for use any verification environment without conflict or needless overhead.

Similarly, the coupling interfaces 605 (shown in FIG. 3A) coupling the co-verification interfaces 600P, 600V and the system elements 300, 400 have constructions that are application-dependent. The application layer 610 of the virtual co-verification interface 600V can be coupled with the virtual element 400 via an Application Programming Interface (API) written in the high-level programming language C (C API). The virtual element 400 is configured to use the C API to control the communication connections of the application layer 610. When the communication connections are open, the virtual element 400 can send the outgoing communication signals to the physical element 300 and/or check for, and receive, the incoming communication signals from the physical element 300. The communication signals can be exchanged between the virtual element 400 and the physical element 300 with any protocol, including an open-ended protocol, a closed-ended protocol, a time-limited blocking protocol, and/or a non-blocking protocol. A transmitting system element 300, 400 is provided with one opportunity to successfully transmit the communication signal under the open-ended protocol; whereas, the closed-ended protocol permits the transmitting system element 300, 400 a plurality of opportunities over a predetermined time interval to successfully transmit the communication signal. When the relevant communication connection is busy, the transmitting system element 300, 400, operating under the time-limited blocking protocol, waits until the communication connection is clear before sending the communication signal; however, under the non-blocking protocol, the transmitting system element 300, 400 returns an error message upon encountering a busy communication connection.

Turning to the physical co-verification interface 600P, the application layer 610 also can include the coupling interface 605 for coupling with the physical element 300 in the manner described above. The coupling interface 605 preferably comprises a standard interface such as a Peripheral Virtual Component Interface (PVCI). Being well defined, the Peripheral Virtual Component Interface supports the functionality of a wide variety of standardized busses, including system-on-chip busses, and can be used as a transaction-level physical API for the protocol stack 650 (shown in FIG. 3A) of the physical co-verification interface 600P. If the electrical connection 661 comprises a bus protocol that is not compatible Peripheral Virtual Component Interface, an additional interface, such as the transactor 602, can be disposed between the physical element 300 and the Peripheral Virtual Component Interface, and/or the application layer 610 can provide a different coupling interface 605 that supports the incompatible bus protocol. For example, when the coupling interface 605 includes a signal-level interface, such as a signal-level physical API, the signal-level interface can include additional control signals, such as a sample/update signal and a clock signal, and a signal change detection system. The additional control signals are configured to initiate and exchange the communication signals between the physical element 300 and the application layer 610; whereas, the signal change detection system senses level changes in the communication signals for minimizing interface messaging.

As shown in FIG. 4, the network layers 620 of the co-verification interfaces 600 are disposed substantially between the application layers 610 and the data link layers 630. Each network layer 620 is configured to receive the outgoing communication signals from the relevant application layer 610 via the electrical connections 662. One or more electrical connections 663 couple the network layer 620 and the data link layer 630, and, in the manner discussed above with reference to the electrical connections 661, the configuration of the electrical connections 663 is application-dependent and can comprise one or more electrical links. The network layer 620 is configured to receive the outgoing communication signals provided by the electrical connections 662 of the relevant application layer 610 and to route selected outgoing communication signals to the relevant data link layer 630. The selected outgoing communication signals can be selected in accordance with any predetermined criteria, including an order in which the outgoing communication signals are received by the network layer 620 and/or a priority of the outgoing communication signals.

For example, the network layer 620 can be coupled with the data link layer 630 via a plurality of electrical connections 663 as illustrated in FIG. 4. In the manner described above with reference to the application layer 610, the network layer 620 can include a plurality of communication connections (not shown) that couple the electrical connections 662 and the electrical connections 663 such that two-way communication of the communication signals is permitted between the application layer 610 and the data link layer 630. The network layer 620 thereby is configured to communicate the outgoing communication signals from the application layer 610 to the data link layer 630 and to receive the incoming communication signals from the data link layer 630 to the application layer 610 via the communication connections of the network layer 620.

In the manner described above with reference to the electrical connections 661, 662, the electrical connections 663 preferably comprise unidirectional electrical connections for transmitting or receiving the communication signals. For example, an electrical connection 663a can comprise a unidirectional electrical connection that is coupled with the electrical connection 662a via the network layer 620 and that is configured to transmit outgoing communication signals from the application layer 610 to the data link layer 630. The application layer 610 likewise can receive incoming communication signals from the data link layer 630 via a unidirectional electrical connection 663b, which is coupled with the electrical connection 662a via the network layer 620. The electrical connections 663a, 663b can be paired to form a bi-directional electrical connection between the network layer 620 and the data link layer 630. The bi-directional channel pair of the communication channel thereby extends through the network layer 620.

The network layer 620 also is configured to control the communication connection coupling the electrical connections 662 and the electrical connections 663. Thereby, the network layer 620 can open the communication connection associated with the selected outgoing communication signals such that the selected outgoing communication signals can be provided to the data link layer 630. The remaining communication connections preferably remain closed to inhibit the other communication signals from being provided to the network layer 620. For example, the network layer 620 of the physical co-verification interface 600P can select the outgoing communication signals associated with the electrical connection 662a by opening the communication connection coupling the electrical connection 662a with the electrical connection 663a and by closing the communication connection coupling the electrical connection 662b with the electrical connection 663b. Thereby, the outgoing communication signals associated with the electrical connection 662a are selected and provided to the data link layer 630. Likewise, the outgoing communication signals associated with the electrical connection 662b can be selected and provided to the data link layer 630 by closing the communication connection coupling the electrical connection 662a with the electrical connection 663a and by opening the communication connection coupling the electrical connection 662b with the electrical connection 663b.

The virtual co-verification interface 600V illustrates another configuration of the network layer 620. Here, the network layer 620 is coupled with the data link layer 630 via one electrical connection 663. The electrical connection 663 of the virtual co-verification interface 600V is common to each of the electrical connections 662 coupling the application layer 610 with the network layer 620. To select the selected outgoing communication signals, the network layer 620 opens a communication connection (not shown) that couples the relevant electrical connections 662 to the electrical connection 663 such that the selected outgoing communication signals are provided to the data link layer 630. As desired, the electrical connection 663 comprise a bi-directional communication channel and/or can include an outgoing electrical connection 663c and an incoming electrical connection 663d as shown in FIG. 4. Comprising a unidirectional communication link, the outgoing electrical connection 663c is configured for communicating the selected outgoing communication signals to the data link layer 630.

The network layer 620 also is configured to receive the incoming communication signals from the data link layer 630 and to route the incoming communication signals to at least one selected electrical connection 662 coupling the network layer 620 with the application layer 610. In the manner described in more detail above with reference to the physical co-verification interface 600P, the network layer 620 can be coupled with the data link layer 630 via the plurality of electrical connections 663. The incoming communication signals are provided to one or more of the electrical connections 663, and the network layer 620 selects the selected electrical connection 662 by opening the communication connection associated with the selected electrical connection 662. The remaining communication connections preferably remain closed to inhibit the incoming communication signals from being provided to the other electrical connections 662. Thereby, the incoming communication signals are provided to the selected electrical connection 662.

In the manner described in more detail above with reference to the virtual co-verification interface 600V, the network layer 620 is coupled with the data link layer 630 via the common electrical connection 663. The common electrical connection 663 can comprise the incoming electrical connection 663d, which is a unidirectional communication link and which is configured for receiving the incoming communication signals from the data link layer 630. The network layer 620 can select the selected electrical connection 662 by opening the communication connection associated with the selected electrical connection 662 such that the incoming communication signals are provided to the selected electrical connection 662. The remaining communication connections preferably remain closed to inhibit the incoming communication signals from being provided to the other electrical connections 662.

The network layer 620 can include the coupling interface 625 for coupling the network layer 620 with the data link layer 630. Being disposed substantially between the network layer 620 and the data link layer 630, the coupling interface 625 preferably is a standard interface and facilitates an interchange of interface implementations and/or implementations of the protocol stack 650. In the manner described in more detail above with reference to the coupling interfaces 605, the coupling interfaces 625 have constructions that are application-dependent. With regard to the virtual co-verification interface 600V, for example, the coupling interface 625 can be an Application Programming Interface (API) written in the high-level programming language C (C API). The virtual element 400 is configured to use the C API to control communication connections (not shown) provided by the data link layer 630. Similarly, the coupling interface 625 of the physical co-verification interface 600P preferably comprises a standard interface such as a Peripheral Virtual Component Interface (PVCI) or an Open Core Protocol (OCP).

Being disposed between the network layers 620 and the physical layers 640, the data link layers 630 are configured to allocate and manage message buffers (not shown) and to provide flow control for communication paths 680 (shown in FIG. 3A) provided by the physical layer 640. Each of the data link layers 630 is configured to receive the communication signals from the relevant network layer 620 via the electrical connections 663. One or more electrical connections 664 also are provided to couple the data link layer 630 with the physical layer 640, and, in the manner discussed above with reference to the electrical connections 661, the configuration of the electrical connections 664 is application-dependent and can comprise one or more electrical links. The data link layer 630 is configured to receive the selected outgoing communication signals provided by the electrical connections 663 of the relevant network layer 620 and includes at least one communication connection that is configured to route the selected outgoing communication signals to the physical layer 640.

Likewise, data link layer 630 can receive the incoming communication signals provided by the physical layer 640, and the communication connection of the data link layer 630 can route the incoming communication signals to the electrical connections 663 of the network layer 620. Upon receiving the incoming communication signals, the data link layer 630 provides the relevant network layer 620 with a notification signal. Likewise, the data link layer 630 accepts command signals from the network layer 620 to transmit the outgoing communication signals. The definition of the data link layer 630 permits a wide variety of implementations of the physical layer 640, which implementations can be substituted without affecting the associated system elements 300, 400.

In the manner described above with reference to the electrical connections 661, 662, 663, the electrical connections 664 preferably comprise unidirectional electrical connections for transmitting or receiving the communication signals. For example, an electrical connection 664a can comprise a unidirectional electrical connection that is coupled with the electrical connection 663a via the data link layer 630 and that is configured to transmit outgoing communication signals from the data link layer 630 to the physical layer 640. Also, the data link layer 630 can receive incoming communication signals from the physical layer 640 via a unidirectional electrical connection 664b, which is coupled with the electrical connection 663a via the data link layer 630. The electrical connections 664a, 664b can be paired to form a bi-directional electrical connection between the data link layer 630 and the physical layer 640. The bi-directional channel pair of the communication channel thereby extends through the data link layer 630.

As illustrated in FIG. 4, the data link layer 630 in the physical co-verification interface 600P can comprise a DLL Verilog RTL 631 that is coupled with a link layer system 632. Preferably, the link layer system 632 comprises a PHY-Link Interface provided by Texas Instruments as part number TSB12LV01. In the virtual co-verification interface 600V, the data link layer 630 can be provided as a combination of software components and hardware components. For example, the software components can include custom middleware 636, a custom Open Host Controller Interface (OHCI) driver 637, and a vendor OHCI driver 638; whereas, the hardware components can comprise a link layer system 639. As desired, the link layer system 639 of the virtual co-verification interface 600V can be provided in the same manner described above with reference to the link layer system 632 of the physical co-verification interface 600P.

The data link layers 630 are coupled with the physical layers 640 such that communication signals can be exchanged by the system elements 300, 400. Preferably, the protocol stacks 650 of two or more system elements 300, 400 are coupled via a common physical layer 640. The physical layer 640 can comprise any type of communication medium, including any type of general or special purpose cable, bus, and/or network when the physical layer 640 couples two or more physical elements 300 and/or physical elements 300 with virtual elements 400. The exemplary busses include IEEE-1394 FireWire, Peripheral Component Interconnection (PCI), and Universal Serial Bus (USB); whereas, typical networks include Ethernet, FibreChannel, and local area networks (LANs). If coupling two virtual elements 400, the physical layer 640 preferably comprises shared memory with the virtual co-verification interfaces 600V of the virtual elements 400 exchanging control of the shared memory.

Returning to FIG. 3A, the physical layer 640 preferably provides one or more communication paths 680 between the physical element 300 and the virtual element 400. In the manner described above with reference to the electrical connections 661, 662, 663, 664 (shown in FIG. 4), the communication paths 680 preferably comprise unidirectional communication paths for transmitting or receiving the communication signals. For example, communication path 680a can comprise a unidirectional communication path that is coupled with the electrical connection 664a via the physical layer 640 and that is configured to transmit outgoing communication signals from the physical layer 640 to the virtual element 400. Also, the physical layer 640 can receive incoming communication signals from the virtual element 400 via unidirectional communication path 680b, which is coupled with the electrical connection 664a via the physical layer 640.

The communication paths 680 couple the electrical connections 664 of the data link layers 630 of the system elements 300, 400 such that the system elements 300, 400 can exchange incoming and outgoing communication signals. Typically, two unidirectional communication paths 680, each transmitting the communication signals in opposite directions, are provided between the physical element 300 and the virtual element 400 to form a bi-directional communication path 690. Stated somewhat differently, the physical layer 640 can be configured to support one-way (e.g. streaming) and/or two-way (e.g. command/response) communications between the system elements 300, 400. The bi-directional channel pair of the communication channel thereby extends through the physical layer 640. The configuration of each unidirectional communication path 680 is application-dependent and can comprise a single electrical link for, for example, serial communication signals, and/or a plurality of electrical links, such as a communication bus in the manner discussed in more detail above with reference to the electrical connections 661 (shown in FIG. 4).

One-way communications comprise the transmitting system element 300, 400 and the receiving system element 300, 400 being coupled by one or more unidirectional communication paths 680. For example, the virtual system element 400 can be configured as a master system element and can employ the unidirectional communication paths 680 to transmit the communication signals, such as data, to the physical system element 300, which is configured as a slave system element, such as display device. The unidirectional communication paths 680 comprise general-purpose communication connections and can be used to transmit any type of communication signals. In two-way communications, the system elements 300, 400 can be coupled via at least one bi-directional communication path 690 with one system element 300, 400 acting as a client element and the other system element 300, 400 acting as a server element.

The physical element 300 and the virtual element 400, for example, can be configured to act as the client element and the server element, respectively. Upon identifying a real bus cycle that targets the virtual element 400, the physical co-verification interface 600P can transmit the communication signal, comprising a transaction request message, to the virtual co-verification interface 600V. The virtual element 400, running in simulation, performs its own local system activity and regularly polls the virtual co-verification interface 600V for incoming transaction request messages. The transactor 602 of the physical co-verification interface 600P translates the transaction request message into a stimulus for the bus interface of the virtual element 400. The virtual element 400 then produces a bus response, and the virtual co-verification interface 600V translates the bus response into a transaction response message. The transaction response message is communicated to the physical co-verification interface 600P via the physical layer 640 to complete the real bus cycle.

The physical layer 640 preferably is configured to communicate via unidirectional point-to-point static circuits such that the communication signals are transmitted peer-to-peer and such that a central server is not needed. The communication paths 680 preferably are established at verification run time such that the communication paths 680 are "plug-and-play." That is, the system elements 300, 400 can initialize in any sequence. For example, if the virtual element 400 initializes before the physical element 300, the co-verification interfaces 600 are configured to initiate communications between the system elements 300, 400 when the physical element 300 initializes. Each protocol stack 650 is initiated via a common XML registry file that is configured to establish a connection with the other protocol stacks 650. Thereby, different instances of the same system element 300, 400, such as a SystemC model and a Field Programmable Gate Array (FPGA) prototype of the system element 300, 400, may be freely selected without recompilation.

The speed of the design verification system 200 primarily depends upon the latency of the communication signals that are exchanged between the system elements 300, 400. Hardware roundtrip latency under ten microseconds can be achieved through the use of a lightly loaded Peripheral Component Interconnection (PCI) bus when installed in a host workstation. Similar performance can be achieved via IEEE-1394 FireWire when operated in asynchronous mode. Software latency in the physical layer 640 can be reduced by avoiding task switching and by using memory-mapped Direct Memory Access (DMA) between the virtual co-verification interface 600V and the physical co-verification interface 600P.

In operation, the design verification system 200 provides two operational modes for synchronizing the system elements 300, 400. The operational mode of the design verification system 200 can be determined by any of the system elements 300, 400. In uncoupled mode, the system elements 300, 400 operate independently, and neither system element 300, 400 attempts to synchronize with the other system element 300, 400. Thereby, each system element 300, 400 can operate freely, subject to interactions with the other system element 300, 400, such as waiting for the other system element 300, 400 to complete a transaction. By operating in uncoupled mode, the design verification system 200 can quickly perform system verification.

The design verification system 200 also can operate in coupled mode. Since coupled mode comprises a more complex operational mode, the design verification system 200 operates more slowly, but is cycle accurate, in coupled mode. In coupled mode, the system elements 300, 400 share a common clock domain. For example, the physical element 300 and the virtual element 400 each operate during the same clock cycle of the system clock, which is controlled by the physical co-verification interface 600P. Any communication signals, such as messages and/or transactions, are exchanged between the system elements 300, 400 on the clock boundaries of the system clock. The co-verification interfaces 600 preferably do not include any combinatorial loops to ensure that one evaluation of each clock system is correct.

To accelerate operation of the design verification system 200, coupled mode can provide an extended operation period before the communication signals are exchanged between the system elements 300, 400. The extended operation period can comprise more than one clock cycle, such as a predetermined number of clock cycles. The predetermined number can be provided in a configuration register (not shown) of each co-verification interface 600. If the physical element 300 provides a communication signal during the extended operation period, the communication signal from the physical element 300 can be sent on the clock boundary of the current clock cycle without waiting for the end of the extended operation period.

It will be appreciated that considerable debugging of the electronic system 100 can be achieved while the virtual element 400 remains in a virtual form. Once the electronic system 100 is sufficiently stable, the virtual element 400 can be refined to a register transfer level (RTL) form for further evaluation and testing. The virtual element 400 subsequently can be compiled into a field programmable gate array for more extensive verification at full speed. As each virtual element 400 is converted to a physical form, system performance and verification coverage of the electronic system 100 increase.

Figure 5:
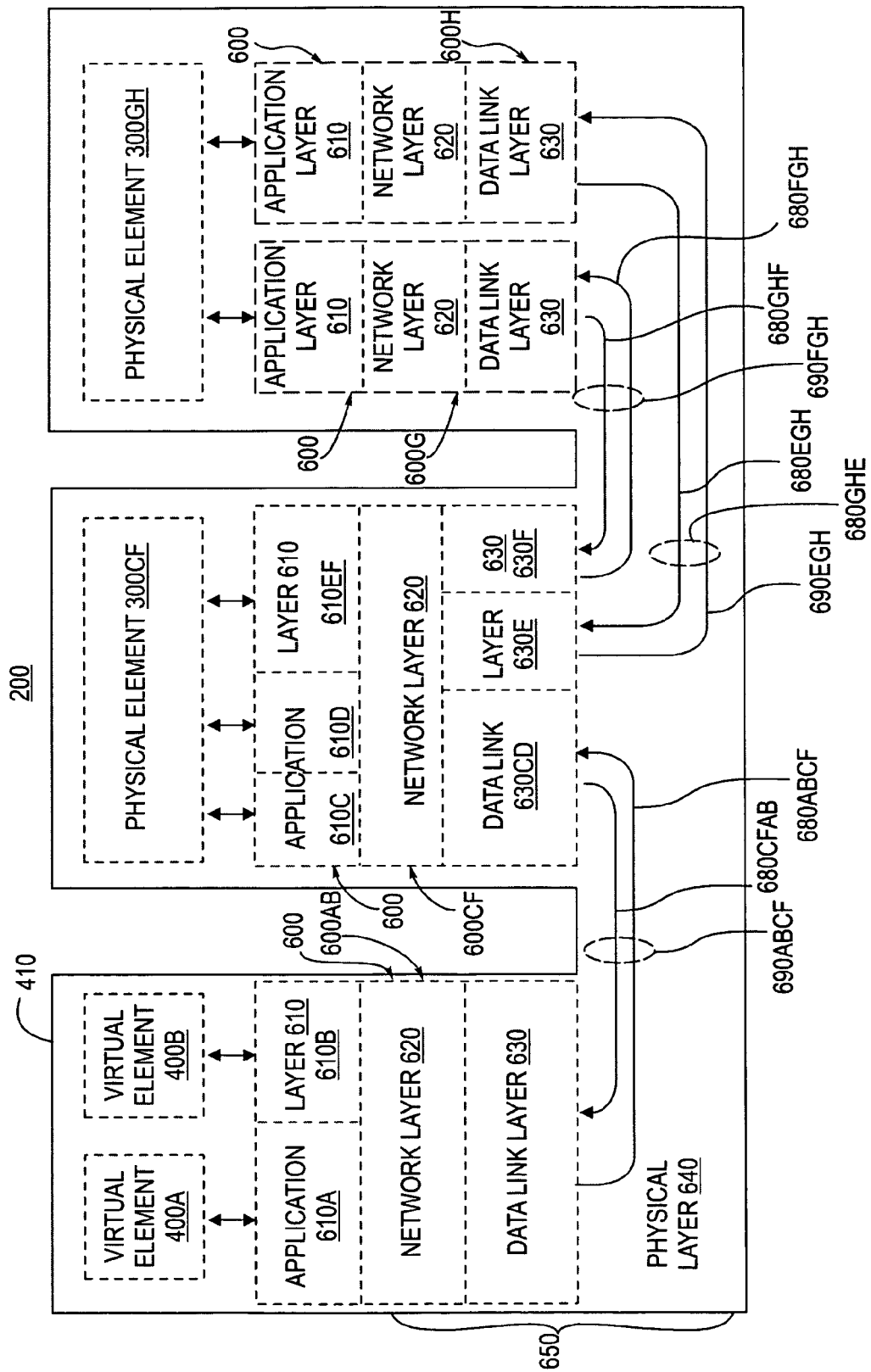
FIG. 5 illustrates another alternative embodiment of the co-verification interface of FIG. 2 in which the layers of the co-verification interfaces are segmented.

Although illustrated in FIGS. 3A-B and 4 as having one co-verification interface 600, the system elements 300, 400 each can be provided with two or more co-verification interfaces 600, for example, when three or more physical elements 300 and/or virtual elements 400 are included in the design verification system 200. Turning to FIG. 5, the design verification system 200' includes the virtual elements 400A, 400B and the physical elements 300CF, 300GH, which can be provided in the manner described in more detail above with regard to the virtual element 400 (shown in FIGS. 3A-B and 4) and the physical element 300 (shown in FIGS. 3A-B and 4), respectively. When coupled with two co-verification interfaces 600G, 600H as shown in FIG. 5, the physical element 300GH can be provided with two or more unidirectional communication paths 680EGH, 680GHE, 680FGH, 680GHF and/or bi-directional communication paths 690EGH, 690FGH across the physical layer 640 for communicating with the other system elements 400A, 400B, 300CF. The design verification system 200' thereby supports two bi-directional communication paths 690EGH, 690FGH for exchanging communication signals (not shown) between the system elements 300CF, 300GH in the manner described in more detail above with reference to the design verification system 200 (shown in FIGS. 3A-B and 4).

As desired, the bi-directional communication paths 690EGH, 690FGH can comprise substantially independent communication paths provided on separate physical layers and/or can be provided on the same physical layer 640 as shown in FIG. 5. Further, the bi-directional communication paths 690EGH, 690FGH can support the same, or different, communication protocols. For example, the communication path 690EGH can support the communication signals provided in accordance with the IEEE-1394 FireWire protocol standard; whereas, the bi-directional communication path 690FGH can support the communication signals provided in accordance with the Interprocess Communication (IPC) pipes protocol standard. It is understood that each of the communication paths 690EGH, 690FGH can support a plurality of transaction-level communication signals and/or a plurality of signal-level communication signals that can be transmitted in both directions, that have substantially the same and/or different synchronizations, and/or that are configured to serve the same and/or different portions of the design verification system 200'. Although the physical element 300GH is shown and described as comprising a physical element having two co-verification interfaces 600G, 600H, it is understood that the physical element 300GH can comprise a virtual element and that the physical element 300GH can include any number and/or configuration of co-verification interfaces 600 for coupling the physical element 300GH with two or more system elements 400A, 400B, 300CF.

It will likewise be appreciated that a co-verification interface 600AB can be used to couple two or more system elements 400A, 400B disposed, for example, on the same development platform 410, with the system element 300CF as illustrated in FIG. 5. Having a plurality of communication connections (not shown) provided in the manner described in more detail above with reference to the application layer 610 shown in FIG. 4, the application layer 610 of the co-verification interface 600AB can be segmented into application layer segment 610A and application layer segment 610B. The application layer segments 610A, 610B preferably each include coupling interfaces (not shown) that are provided in the manner described above with reference to the coupling interfaces 605 (shown in FIG. 3A) and that are configured to provide a universal interface for coupling the co-verification interface 600AB with the system elements 400A, 400B. Thereby, one or more of the communication connections are associated with the application layer segment 610A and are coupled with, and configured to communicate with, the system element 400A; whereas, the system element 400B is coupled with, and configured to communicate with, the communication connections that are associated with the application layer segment 610B.

The system elements 400A, 400B are respectively configured to transmit outgoing communication signals (not shown) and to receive incoming communication signals (not shown) via the application layer segments 610A, 610B of the application layer 610 in the manner described in more detail above with regard to the application layer 610 shown in FIG. 4. The network layer 620 of the co-verification interface 600AB, in turn, is configured to receive the outgoing communication signals from the system elements 400A, 400B and to route selected outgoing communication signals to the data link layer 630 in the manner discussed in more detail above with respect to the network layer 620 shown in FIG. 4. The data link layer 630 then can communicate the selected outgoing communication signals to the system element 300CF via unidirectional communication paths 680ABCF, 680CFAB and/or bi-directional communication paths 690ABCF in the manner discussed above with reference to the communication paths 680, 690 shown in FIG. 3A. Also being configured to receive the incoming communication signals from the system element 300CF via the communication paths 680ABCF, 680CFAB, 690ABCF, the data link layer 630 of the co-verification interface 600AB can provide the incoming communication signals to the network layer 620 of the co-verification interface 600AB. The network layer 620 can route the incoming communication signals to the appropriate system element 400A, 400B to selecting the appropriate communication connection of the application layer 410.

Although the co-verification interface 600AB is shown and described as comprising two application layer segments 610A, 610B, it will be appreciated that the application layer 610 can include any number and/or configuration of application layer segments 610A, 610B for coupling any number of system elements 400A, 400B with the co-verification interface 600AB. Likewise, the system elements 400A, 400B each can be coupled with, and configured to communicate with, more than one application layer segments 610A, 610B and that each application layer segments 610A, 610B can be configured to couple and communicate with one or more system elements 400A, 400B. The application layer segments 610A, 610B can support the same, or different, types of communication signals, such as events, messages, transactions, and/or debugging commands. It is also understood that the system elements 400A, 400B can comprise any number and/or combination of physical elements and/or virtual elements.

Alternatively, or in addition, one or more of the layers 610, 620, 630, and 640 of the of the co-verification interface 600 can be segmented as illustrated with the co-verification interface 600CF as shown in FIG. 5. The co-verification interface 600CF can be provided in the manner described in more detail above with reference to the co-verification interface 600 shown in FIGS. 3A-B and 4 and is coupled with the physical element 300CF. In addition, the application layer 610 of the co-verification interface 600CF can be segmented into application layer segment 610C, application layer segment 610D, and application layer segment 610EF; whereas, the data link layer 630 can be segmented into data link layer segment 630CD, data link layer segment 630E, and data link layer segment 630F. As illustrated in FIG. 5, the application layer segments 610C, 610D, 610EF are coupled with the physical element 300CF, preferably via coupling interfaces (not shown) that are provided in the manner described above with reference to the coupling interfaces 605 (shown in FIG. 3A) and that are configured to provide a universal interface for coupling the co-verification interface 600CF with the physical element 400CF. The application layer segments 610C, 610D, 610EF can be configured to support the same, or different, types of communication signals, such as events, messages, transactions, and/or debugging commands. Thereby, the co-verification interface 600CF can be configured to support a plurality of different types of communication signals.

The data link layer segments 630CD, 630E, 630F of the data link layer 630 are coupled with, and configured to communicate with, the application layer segments 610C, 610D, 610EF of the application layer 610 via the network layer 620 in the manner described above with regard to the co-verification interface 600 shown in FIGS. 3A-B and 4. Preferably, the data link layer segments 630CD, 630E, 630F are coupled with the network layer 620 via coupling interfaces (not shown) that are provided in the manner described above with reference to the coupling interfaces 625 (shown in FIG. 3A) and that are configured to provide a universal interface for coupling the co-verification interface 600CF with the physical layer 640. It will be appreciated that the data link layer segments 630CD, 630E, 630F can be configured to support the same, or different, types of communication protocols within the physical layer 640. For example, the communication path 690EGH can support the communication signals provided in accordance with the IEEE-1394 FireWire protocol standard; whereas, the communication paths 690ABCF, 690FGH each can support the communication signals provided in accordance with the Interprocess Communication (IPC) pipes protocol standard. The co-verification interface 600CF thereby can be configured to support a plurality of different types of communication protocols.

As illustrated in FIG. 5, for example, the co-verification interface 600CF can be configured to receive outgoing communication signals (not shown) from the physical element 300CF via the application layer segments 610C, 610D and to provide selected outgoing communication signals to the virtual element 400A and/or the virtual element 400B. If the physical element 300CF transmits debugging commands and transactions, for instance, the application layer segment 610C can be configured to support the debugging commands, and the application layer segment 610D can be configured to support the transactions. The network layer 620 can be configured to select the debugging commands associated with the application layer segment 610C and/or transactions associated with the application layer segment 610D and to route selected outgoing communication signals to the data link layer segment 630CD. In the manner described above with respect to the co-verification interface 600 shown in FIGS. 3A-B and 4, the selected outgoing communication signals are communicated to the co-verification interface 600AB via the bi-directional communication paths 690ABCF and then are provided to the virtual element 400A and/or the virtual element 400B by way of the co-verification interface 600AB.

The co-verification interface 600CF also can be configured to receive incoming communication signals from, for example, the virtual element 400A via the communication paths 690ABCF in the manner discussed above with regard to the co-verification interface 600 shown in FIGS. 3A-B and 4. Upon receiving the incoming communication signals, the data link layer 630CD can provide the incoming communication signals to the network layer 620, which is configured to route the incoming communication signals to the application layer segment 610C and/or the application layer segment 610D. The appropriate application layer segment 610C, 610D preferably is selected based at least in part upon the type of communication signals supported. Therefore, if the incoming communication signals comprise debugging commands, the network layer can route the incoming communication signals to the application layer segment 610C; whereas, the incoming communication signals that comprise transactions are routed to the application layer segment 610D. Thereby, the incoming communication signals are provided to the physical element 300CF by the relevant application layer segment 610C, 610D.

Likewise, the physical element 300CF can be configured to exchange communication signals (not shown) with the physical element 300GH via the co-verification interface 600CF. The physical element 300CF transmits outgoing communication signals to the application layer segment 610EF. The type of outgoing communication signals transmitted to the application layer segment 610EF can be the same as, or different from, the types of communication signals associated with the application layer segment 610C and/or the application layer segment 610D. The network layer 620 can be configured to receive the outgoing communication signals from the application layer segment 610EF and to selectably provide the outgoing communication signals to the data link layer segment 630E and/or the data link layer segment 630F. The appropriate data link layer segment 630E, 630F preferably is selected based at least in part upon the communication protocols supported by the media coupling the physical elements 300CF, 300GH.

For example, the communication path 690EGH can support the communication signals provided in accordance with the IEEE-1394 FireWire protocol standard; whereas, the bi-directional communication path 690FGH can support the communication signals provided in accordance with the Interprocess Communication (IPC) pipes protocol standard. Therefore, when the outgoing communication signals are to be transmitted in accordance with the IEEE-1394 FireWire protocol standard, the network layer 620 can route the communication signals to the data link layer segment 630F for transmission to the physical element 300GH via the communication path 690FGH. The network layer 620 likewise routes the communication signals associated with the Interprocess Communication (IPC) pipes protocol standard to the data link layer segment 630E for transmission to the physical element 300GH via the communication path 690EGH.

Similarly, incoming communication signals from the physical element 300GH can be provided to the co-verification interface 600CF via the communication path 690FGH and/or the communication path 690EGH. The incoming communication signals are provided in the communication protocols supported by the media coupling the physical elements 300CF, 300GH in the manner described above. Upon receiving the incoming communication signals, the data link layer segments 630E, 630F are configured to provide the incoming communication signals to the network layer 620. The network layer 620 then routes the incoming communication signals to the appropriate communication connections of the application layer segment 610EF in the manner described in more detail above with regard to the co-verification interface 600 shown in FIGS. 3A-B and 4. The incoming communication signals then are provided to the physical element 300CF by the application layer segment 610EF.

Although the co-verification interface 600CF is shown and described as comprising three application layer segments 610C, 610D, 610EF, three data link layer segments 630CD, 630E, 630F, it will be appreciated that the co-verification interface 600CF can be expanded to any number of application layer segments and/or data link layer segments. It also is understood that the network layer 620 and the physical layer 640 each can be segmented into any number of network layer segments and physical layer segments, respectively, and that the communication paths 690ABCF, 690EFGH, 690FGH comprise a form of segmenting the physical layer 640. Likewise, the application layer segments 610C, 610D, 610EF, the network layer segments, the data link layer segments 630CD, 630E, 630F, and the physical layer segments 690ABCF, 690EFGH, 690FGH can be provided in any configuration and/or arrangement. The application layer segments 610C, 610D were shown and described as being associated with the data link layer segment 630CD and the application layer segment 610EF was shown and described as being associated with the data link layer segments 630E, 630F for purposes of illustration only. Stated somewhat differently, each layer 610, 620, 630, 640 of the co-verification interface 600CF can be associated with any number and/or arrangement of the other layers 610, 620, 630, 640 of the co-verification interface 600CF.

The invention is susceptible to various modifications and alternative forms, and specific examples thereof have been shown by way of example in the drawings and are herein described in detail. It should be understood, however, that the invention is not to be limited to the particular forms or methods disclosed, but to the contrary, the invention is to cover all modifications, equivalents, and alternatives falling within the spirit and scope of the claims.

What is claimed is:

1. A co-verification interface, comprising a hardware component of a design verification system, a software component of the design verification system modeling the hardware component and being stored on a storage device, or a combination of the hardware and software components, the co-verification interface further comprising:
   an application layer having a plurality of communication connections configured to communicate with a first system element of the design verification system, wherein the design verification system performs functional verification of at least two system elements of a logic design including the first system element and a second system element;
   a network layer in communication with said plurality of communication connections and being configured to select a communication connection from said plurality of communication connections;
   a data link layer having a communication connection in communication with said selected communication connection and being configured to communicate with said network layer to provide flow control for said communication connection of said data link layer; and
   a physical layer having a communication path in communication with said communication connection of said data link layer and being configured to communicate with the second system element of the design verification system only via the communication system,
   wherein the first system element and the second system element are either a physical system element or a virtual system element, and
   wherein the physical system element comprises one or more electronic components and the virtual system element comprises software models of the physical system element.

2. The co-verification interface of claim 1, wherein said application layer is configured to couple with said first system element via a standard coupling interface.

3. The co-verification interface of claim 2, wherein said standard coupling interface comprises an Application Programming Interface.

4. The co-verification interface of claim 2, wherein said standard coupling interface comprises a Peripheral Virtual Component Interface.

5. The co-verification interface of claim 2, wherein said standard coupling interface comprises an Open Core Protocol.

6. The co-verification interface of claim 1, wherein said co-verification interface is configured to communicate outgoing communication signals from said first system element to said second system element.

7. The co-verification interface of claim 1, wherein said co-verification interface is configured to communicate incoming communication signals from said second system element to said first system element.

8. The co-verification interface of claim 1, wherein said application layer is configured to couple with a virtual system element.

9. The co-verification interface of claim 1, wherein said application layer is configured to open and close each of said plurality of communication connections.

10. The co-verification interface of claim 1, wherein said plurality of communication connections of said application layer is configured to communicate with a plurality of system elements.

11. The co-verification interface of claim 1, wherein said application layer is segmented into a plurality of application layer segments each including at least one of said plurality of communication connections.

12. The co-verification interface of claim 11, wherein at least two of said application layer segments support different types of communication signals.

13. The co-verification interface of claim 1, further comprising a standard interface for coupling said data link layer with said physical layer.

14. The co-verification interface of claim 13, wherein said standard interface is disposed substantially between said network layer and said data link layer.

15. The co-verification interface of claim 1, wherein:
   said network layer is configured to select at least one communication connection from said plurality of communication connections;
   said data link layer is segmented into a plurality of data link layer segments each having a communication connection in communication with at least one of said at least one communication connection and being configured to communicate with said network layer to provide flow control for said at least one of said at least one communication connection; and
   said physical layer includes a plurality of communication paths, said communication connection of each of said plurality of data link layer segments each being in communication with one of said plurality of communication paths.

16. The co-verification interface of claim 15, wherein at least two of said data link layer segments support different types of communication signals.

17. The co-verification interface of claim 1, wherein said physical layer configured to couple with a physical system element.

18. The co-verification interface of claim 1, wherein said communication path of said physical layer comprises at least one unidirectional communication path.

19. The co-verification interface of claim 1, wherein said physical layer forms at least one bi-directional communication path comprising a pair of unidirectional communication paths, each being configured to transmit communication signals in opposite directions.

20. The co-verification interface of claim 1, wherein said physical layer is configured to communicate with said second system element via a second co-verification interface.

21. A co-verification comprising a hardware component of a design verification system, a software component modeling the hardware component and being stored on a storage device of the design verification system, or a combination of the hardware and software components, the co-verification interface further comprising:
- a first application layer having a plurality of communication connections configured to communicate with a physical system element, wherein the design verification system performs functional verification of at least two system elements of a logic design including the physical system element and a virtual system element;
- a first network layer in communication with said plurality of communication connections of said first application layer and being configured to select a first communication connection from said plurality of communication connections of said first application layer;
- a first data link layer having a communication connection in communication with said first communication connection and being configured to communicate with said first network layer to provide flow control for said communication connection of said first data link layer;
- a second application layer having a plurality of communication connections configured to communicate with the virtual system element;
- a second network layer in communication with said plurality of communication connections of said second application layer and being configured to select a second communication connection from said plurality of communication connections of said second application layer;
- a second data link layer having a communication connection in communication with said second communication connection and said communication path and being configured to communicate with said second network layer to provide flow control for said communication connection of said second data link layer; and
- a physical layer having a communication path in communication with said communication connection of said first data link layer and with said communication connection of said second data link layer, wherein the physical system element and the virtual system element communicate only via the physical layer,
- wherein the physical system element comprises one or more electronic components and the virtual system element comprises software models of the physical system element.

22. A design verification system comprising:
- a first system element of a logic design;
- a second system element of the logic design;
- a co-verification interface comprising a hardware component, a software component modeling the hardware component and being stored on a storage device, or a combination of the hardware and software components; and
- a communication system coupling said first and second system elements of the logic design, said first system element being coupled with said communication system and configured to communicate with the second system element via the co-verification interface, comprising:
    - an application layer having a plurality of communication connections configured to communicate with said first system element;
    - a network layer in communication with said plurality of communication connections and being configured to select a communication connection from said plurality of communication connections;
    - a data link layer having a communication connection in communication with said selected communication connection and being configured to communicate with said network layer to provide flow control for said communication connection of said data link layer; and
    - a physical layer having a communication path in communication with said communication connection of said data link layer and being configured to communicate with said second system element,
- wherein the design verification system performs functional verification of the first system element and the second system element, the first system element and the second system element being either a physical system element or a virtual system element, and
- wherein the physical system element comprises one or more electronic components and the virtual system element comprises software models of the physical system element.

23. The design verification system of claim 22, wherein said second system element is coupled with said communication system and configured to communicate with the first system element via a second co-verification interface, comprising:
- a second application layer having a plurality of communication connections configured to communicate with said second system element;
- a second network layer in communication with said plurality of communication connections of said second application layer and being configured to select a second communication connection from said plurality of communication connections of said second application layer; and
- a second data link layer having a communication connection in communication with said second communication connection and said communication path and being configured to communicate with said second network layer to provide flow control for said communication connection of said second data link layer.

24. The design verification system of claim 22, further comprising a third system element, said first system element being coupled with said communication system and configured to communicate with said third system element via a third co-verification interface, comprising:
- a third application layer having a plurality of communication connections configured to communicate with said first system element;
- a third network layer in communication with said plurality of communication connections of said third application layer and being configured to select a third communication connection from said plurality of communication connections of said third application layer;
- a third data link layer having a communication connection in communication with said third communication connection and being configured to communicate with said third network layer to provide flow control for said communication connection of said third data link layer; and
- said physical layer having a second communication path in communication with said third communication connection and configured to communicate with said third system element.

25. A method for coupling system elements of a design verification system, comprising:
- providing an application layer with a first plurality of communication connections to couple a first system element of the design verification system via a first universal coupling interface;
- configuring said first plurality of communication connections of the application layer to communicate with said first system element;

providing a network layer in communication with said first plurality of communication connections;

configuring the network layer to select at least one communication connection from said first plurality of communication connections;

providing a data link layer having a communication connection in communication with said at least one selected communication connection;

configuring the data link layer to communicate with said network layer and to provide flow control for said at least one communication connection;

providing a physical layer having a communication path in communication with said communication connection of said data link layer; and transmitting outgoing communication signals from said first system element to a second system element of the logic design via the physical layer, wherein the design verification system performs functional verification of the first system element and the second system element of the design verification system, the first system element and the second system element being either a physical system element or a virtual system element, and wherein the physical system element comprises one or more electronic components and the virtual system element comprises software models of the physical system element.

26. The method of claim 25, further comprising receiving said outgoing communication signals at said second system element via said at least one communication connection.

27. The method of claim 26, further comprising:

coupling said second element with a second plurality of communication connections via a second universal coupling interface;

configuring said second plurality of communication connections to communicate with said second system element;

selecting at least one communication connection from said second plurality of communication connections, said at least one communication connection from said second plurality of communication connections being in communication with said at least one communication connection from said first plurality of communication connections; and receiving said outgoing communication signals at said second system element via said at least one communication connection from said second plurality of communication connections.

28. The method of claim 25, further comprising receiving incoming communication signals from said second system element at said first system element via said at least one communication connection.

29. The method of claim 28, further comprising:

coupling said second element with a second plurality of communication connections via a second universal coupling interface;

configuring said second plurality of communication connections to communicate with said second system element;

selecting at least one communication connection from said second plurality of communication connections, said at least one communication connection from said second plurality of communication connections being in communication with said at least one communication connection from said first plurality of communication connections; and transmitting said outgoing communication signals from said second system element at said first system element via said at least one communication connection from said first plurality of communication connections.

* * * * *